United States Patent [19]

Neukermans et al.

[11] Patent Number: 4,654,581

[45] Date of Patent: Mar. 31, 1987

[54] CAPACITIVE MASK ALIGNER

[75] Inventors: Armand P. Neukermans, Palo Alto; James H. Boyden; Garrett A. Garrettson, both of Los Altos Hills, all of Calif.

[73] Assignee: Hewlett-Packard Company, Palo Alto, Calif.

[21] Appl. No.: 541,385

[22] Filed: Oct. 12, 1983

[51] Int. Cl.[4] .................................... G01R 27/26
[52] U.S. Cl. ...................... 324/61 R; 148/DIG. 102; 340/870.37
[58] Field of Search ............... 324/61 R, 61 P, 61 QL; 340/870.37; 318/662; 29/574, 578; 148/DIG. 102; 378/34, 35

[56] References Cited

U.S. PATENT DOCUMENTS 3,702,467 11/1972 Melnyk ........................ 340/870.37
3,938,113 2/1976 Dobson et al. ................ 340/870.37
3,984,680 10/1976 Smith ............................... 29/574

FOREIGN PATENT DOCUMENTS 0054661 6/1982 European Pat. Off. .
953449 3/1964 United Kingdom .
1484271 9/1977 United Kingdom .
1523943 9/1978 United Kingdom .
2133889 1/1984 United Kingdom .

Primary Examiner—Reinhard I. Eisenzopf
Assistant Examiner—Jack B. Harvey
Attorney, Agent, or Firm—Douglas A. Kundrat

[57] ABSTRACT

An aligner for aligning a mask and a wafer during photolithography of a semiconductor chip uses detection of the differential capacitance between two sets of conductive fingers on the mask and ridges on the wafer. An A.C. signal is coupled between the ridges and the fingers and the phase or amplitude of the signals is detected. An aligner utilizing multiple groups of ridges and fingers allows rotational alignment or two axis lateral alignment. An aligner having reference ledges to which the mask and the wafer are capacitively coupled allows alignment when the distance between the mask and the wafer is too great to permit meaningful capacitive coupling between the mask and the wafer to occur.

19 Claims, 12 Drawing Figures $V_0 \cong f \times R \times (C_{53} - C_{57}) \times V_{SPP}$

CAPACITIVE MASK ALIGNER

BACKGROUND AND SUMMARY OF THE INVENTION

During the processing of an electronic chip a semiconductor wafer is exposed to a radiation source in order to develop a photoresist layer on top of the wafer. A mask is used between the source and the wafer to selectively block the radiation and, thereby, to develop a desired design in the photoresist which controls subsequent etching of the chip. At various processing stages different masks may be used to develop different desired designs on the wafer. It is essential that the various masks be correctly aligned with the wafer so that tight tolerances, allowing, for example, the fabrication of sub-micron width lines, may be maintained.

Optical aligners have been used in the prior art to manually align wafers and masks. Prior art optical aligners have been slow and subject to operator error because of the need to visually align reference marks lying in different planes. Other techniques using Fresnel lenses or diffraction gratings have been proposed but have proved to be adversely sensitive to reference mark variations and have not allowed dynamic control during wafer exposure.

In accordance with the illustrated preferred embodiment of the present invention, alignment is accomplished by detecting a differential capacitance between ridges located on the wafer and sets of interdigitated fingers located on the mask. An electrical signal applied to the wafer is capacitively coupled from the wafer ridges to the overlying mask fingers. The wafer and the mask are aligned when the coupled signals observed on each set of interdigitated fingers are equal in amplitude. Since signal coupling occurs between numerous fingers and ridges, errors due to variations in the fabrication of individual fingers or ridges are averaged if the finger and ridge repetition patterns (constant, chirped or random) are kept substantially identical. Further, rotational or orthogonal alignment may be achieved with the use of multiple finger/ridge sets and alignment may be automated by using the measured signals to control positioning equipment.

In accordance with another preferred embodiment of the present invention, conductive shields are placed between the wafer and interconnecting side lines of the fingers. The shields ensure that coupling only occurs between the ridges and the fingers and not between the ridges and the side lines so that lateral movement of the wafer does not cause variations in the differential capacitance to occur. This allows independent single-dimension alignments to be made.

In accordance with an additional preferred embodiment of the present invention, two sets of fingers are driven by a single driving signal. A phase shifter shifts the driving signal applied to one finger set so that the signal on the finger set is 180 degrees out of phase with the signal on the other finger set. A voltmeter detects a coupled signal on the wafer and a null is observed when alignment is achieved.

In accordance with a further preferred embodiment of the present invention, alignment is achieved with the wafer grounded. A single driving signal is applied to two finger sets through a transformer and a diode bridge and is coupled to ground through the wafer. A recharge path is provided through conductive shields overlaying the finger sets. Alignment is achieved when a D.C. current null is observed.

In accordance with still another preferred embodiment of the present invention, alignment is performed on a mask and a wafer which are separated by a substantial distance as required in some optical lithography or metrology applications. In these applications the distance between the mask and the wafer is too great for meaningful capacitive coupling to occur between the mask and the wafer. Two groups of references, one for the mask and the other for the wafer, are attached to a backbone frame and are initially aligned together. The mask is aligned to one reference and the wafer is aligned to the other reference by measurement of the differential capacitances involved.

DETAILED DESCRIPTION OF THE PREFERRED EMBODIMENT

Figure 1:
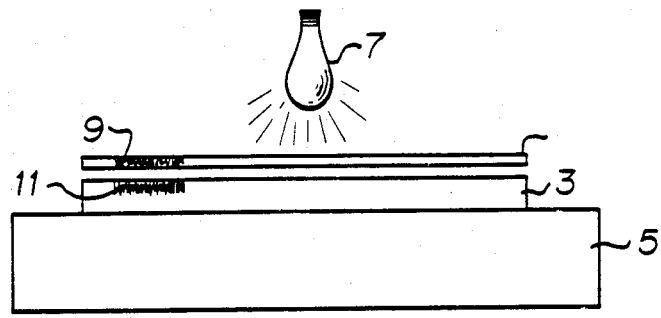
FIG. 1 is a side view of a wafer and mask which are aligned in accordance with the preferred embodiment of the present invention.

FIG. 1 shows a mask 1 aligned with a wafer 3 (mounted on a chuck 5) so that the wafer 3 is irradiated by a source 7 and a desired design is developed on a photoresist coating of wafer 3. Source 7 may generate, for example, visible light or X-rays. Alignment is accomplished by measuring a differential capacitance between a finger region 9 and a wafer array 11.

Figure 2:
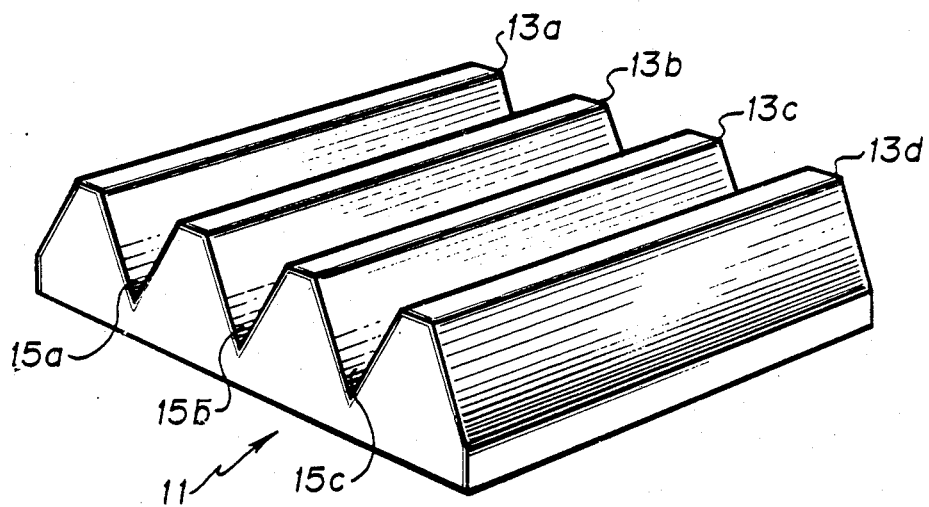
FIG. 2 is a detailed view of the wafer array which is used on the wafer shown in FIG. 1.

FIG. 2 shows a perspective view of a portion of array 11 on wafer 3. Array 11 comprises a series of ridges 13 and valleys 15 which are formed by etching wafer 3. Ridges 13 have a predetermined repetition pattern which may be constant (as shown in FIG. 2) or random or chirped (as shown in FIG. 4B). The wafer 3 is lightly doped so as to have a resistivity on the order of one ohm-centimeter and the ridges 13 and valleys 15 may be coated with a dielectric or conductive layer as required for other processing of the wafer 3 without affecting the performance of the preferred embodiment of the present invention. If wafer 3 comprises silicon having a [100] orientation, then etching of pattern 11 may be performed with KOH. If other silicon orientations or other materials are used for wafer 3, then fabrication of the ridges 13 and valleys 15 may be performed using any of a number of well known orientation dependent etchants. If a GaAs wafer 3 is used, ridges 13 may comprise conductive traces which are deposited upon the insulating GaAs wafer 3. Valleys 15 then comprise the insulating GaAs and air gaps between individual conductive traces.

Figure 3A:
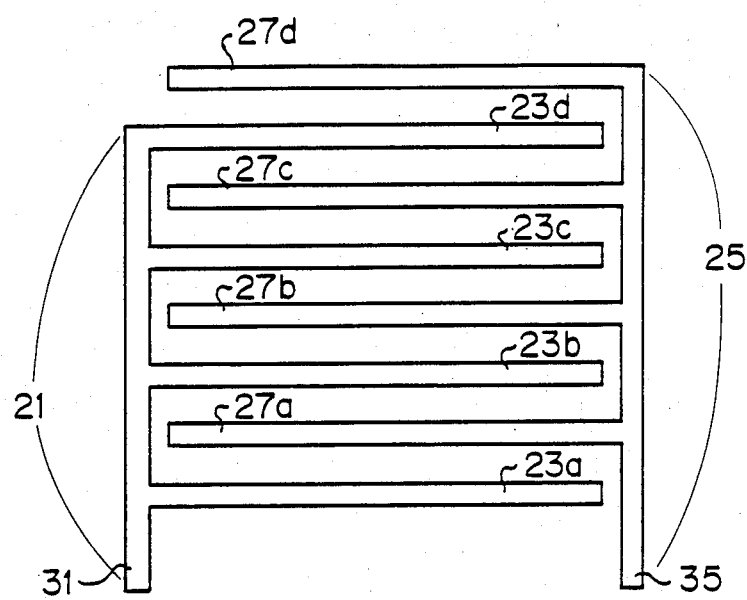
FIGS. 3A-B provide detailed views of the interdigitated fingers which are located on the mask shown in FIG. 1.

FIG. 3A shows a detailed view of hand 21 (including side line 31 and fingers 23) and hand 25 (including side line 35 and fingers 27) of finger region 9. Hands 21 and 25 are fabricated as conductive lines which may be printed or deposited upon mask 1. Side lines 31 and 35 of hands 21 and 25 may extend to the edge of mask 1 to allow for external connections. Fingers 23 and fingers 27 are interdigitated and the repetition patterns of fingers 23, fingers 27 and ridges 13 are substantially identical. The effect of specific locational errors of individual fingers is minimized by the averaging effect over the total number of fingers.

Figure 3B:
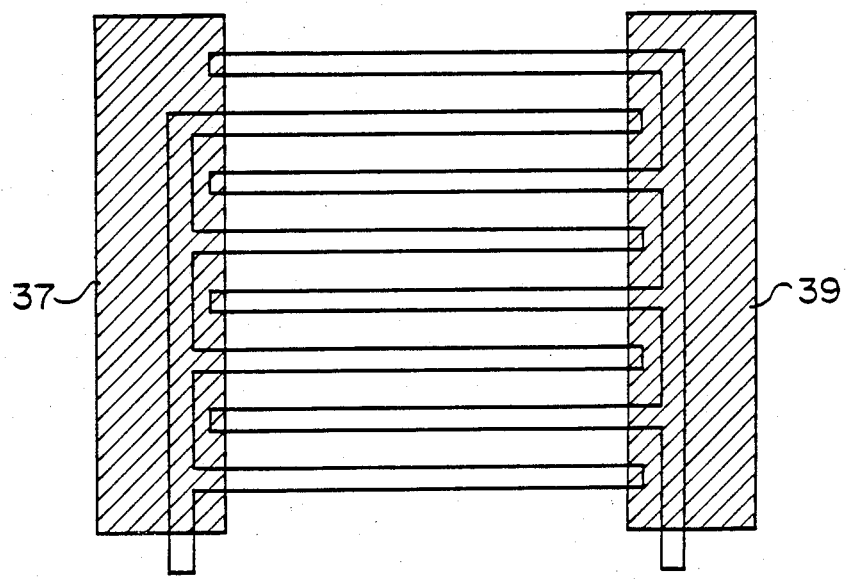

FIG. 3B shows a detailed view of finger region 9 including grounded shields 37, 39. Typically, mask 1 comprises a 3 micron thick boron nitride substrate having a polyimide coating. The hands 21, 25 comprise a gold layer deposited on the polyimide. In order to ensure that capacitive coupling occurs only between ridges 13 and fingers 23, 27 (and not between ridges 13 and side lines 31, 35) grounded shields 37, 39 overlay all side lines 31, 35. Thus, grounded shields 37, 39 are interposed between side lines 31, 35 and wafer 3 to eliminate capacitive coupling between side lines 31, 35 and any portion of wafer 3. Shields 37, 39 may be fabricated by depositing an insulating photoresist layer over hands 21, 25 and then depositing shields 37, 39 as a one micron thick conductive layer (e.g., aluminum) which is then grounded.

Figure 4A:
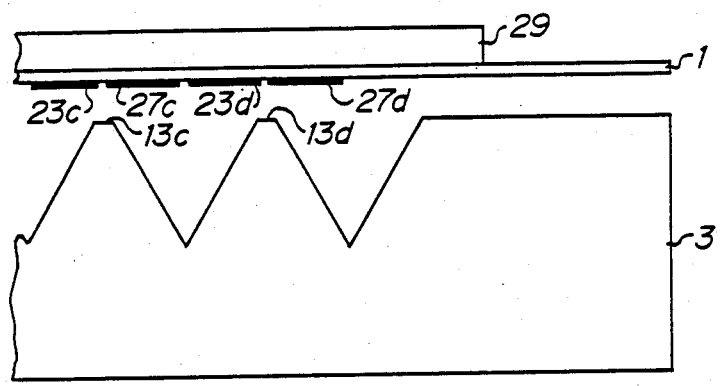
FIGS. 4A-B are exploded side views of the mask and wafer shown in FIG. 1.
Figure 4B:
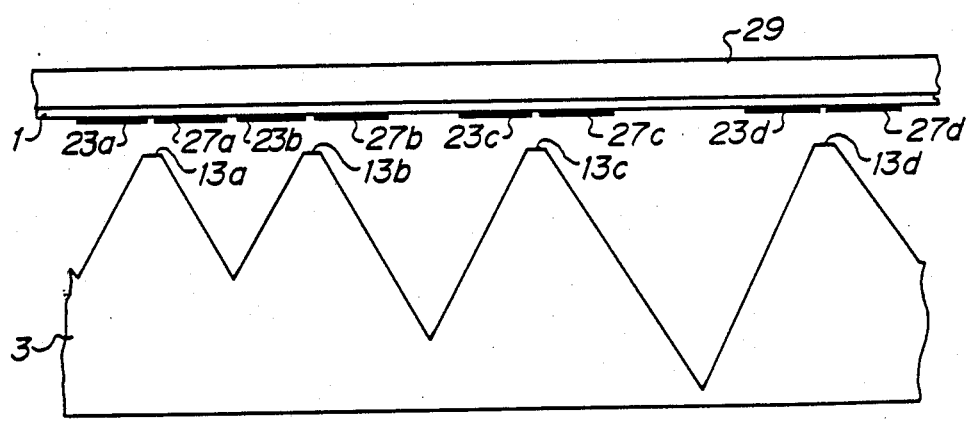

FIG. 4A shows an exploded side view of a portion of mask 1 and wafer 3. The repetition patterns of fingers 23, 27 and ridges 13 are constant and substantially identical. Mask 1 and wafer 3 are in sufficiently close proximity, as is typical in X-ray photolithography, for example, that meaningful capacitive coupling between ridges 13 and fingers 23, 27 occurs. A block 29 may be used to cover finger region 9 on mask 1 so that inadvertent processing of array 11 on wafer 3 does not occur during irradiation of wafer 3. Block 29 may comprise a material which absorbs the radiation generated by source 7.

FIG. 4B shows an exploded side view of a portion of mask 1 and wafer 3 in which the repetition patterns of the ridges 13 and fingers 23, 27 are chirped in spatial frequency. If the repetition patterns of fingers 23, 27 and ridges 13 are substantially identical and aperiodic there will be one unique position at which the ridges 13 are centered between pairs of fingers 23, 27. This permits determination of a single unique alignment. It should be noted that a unique alignment may also be obtained by using identical repetition patterns which are random.

Figure 5:
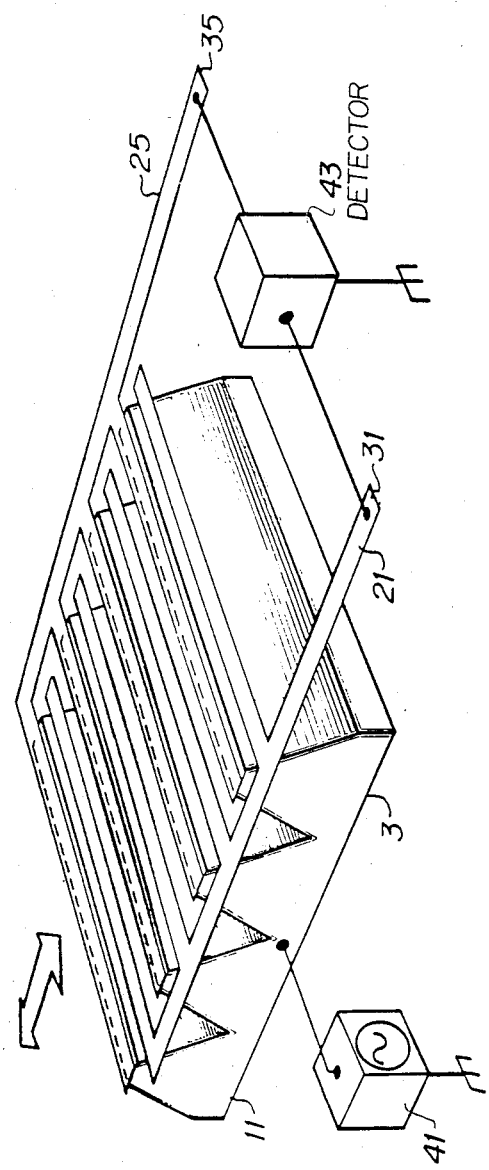
FIG. 5 is a perspective view of the preferred embodiment of the present invention.

FIG. 5 shows a perspective view of the preferred embodiment of the present invention including finger region 9 and array 11 shown in FIGS. 1–4. For the sake of illustrative clarity, mask 1 itself and the remainder of wafer 3 outside of array 11 are not shown in FIG. 5. An oscillator 41 is connected to one side of wafer 3 and an opposite side is grounded. Oscillator 41 impresses a sine wave or other signal across array 11. Side lines 31, 35 of hands 21, 25 are connected to a detector 43 which compares the air coupled capacitance of ridges 13 to fingers 23 and the air coupled capacitance of ridges 13 to fingers 27. Detector 43 may, for example, measure a relative signal amplitude or a relative signal phase.

Figure 6:
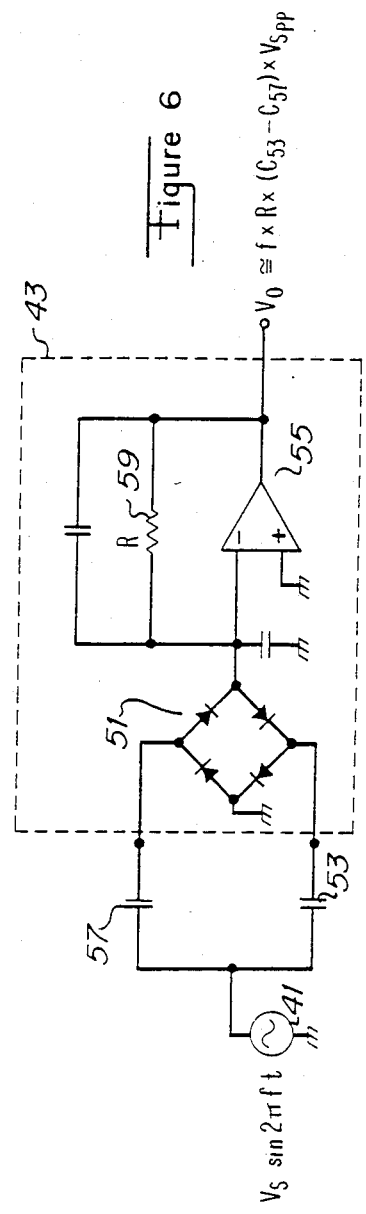
FIG. 6 is a schematic diagram of the detector shown in FIG. 5.

FIG. 6 is a schematic diagram of the detector 43 shown in FIG. 5 which is operative for measuring a relative signal amplitude. Capacitors 53 and 57 represent the capacitive coupling between ridges 13 and fingers 23 and 27, respectively. Bridge 51, comprising matched Schottky barrier diodes, rectifies the signals coupled by capacitors 53, 57 and applies them to amplifier 55 which utilizes a feedback resistor (R) 59. The output of detector 43 is proportional to the difference in capacitance of capacitors 53 and 57 and the output (Vo) is zero when the two capacitances are equal.

An aligner incorporating the preferred embodiment of the present invention shown in FIGS. 1–6 has been used in conjunction with X-ray lithography to allow fabrication of one micron wide lines on a silicon wafer. [100] orientation silicon was used and KOH was utilized as the orientation dependent etchant to create ridges 13 and valleys 15 on wafer 3. The gap between mask 1 and wafer 3 was 30 microns. Array 11 on wafer 3 was 3 by 3 millimeters in size although the size and location of array 11 may be varied as dictated by the particular geometry of the wafer being fabricated. The valleys 15 were approximately 80 microns deep, the tops of ridges 13 were 40 microns wide and the repetition pattern had a constant period of 150 microns. The fingers 23, 27 were 60 microns wide and the constant period of the repetition pattern yielded a 15 micron spacing between adjacent fingers. The sine wave output of oscillator 41 was 100 volts peak-to-peak at 500 KHz.

Using the above-described X-ray lithography aligner, it was found that a 0.07 micron misalignment of mask 1 and wafer 3 created a measurable capacitance differential of approximately 0.28 femtofarad. The relationship between misalignment and capacitance differential was linear since capacitance is inversely proportional to distance. In FIG. 5, the output of detector 43 was zero when each of ridges 13 was centered between a finger 23 and a finger 27. When centering occured the distances between each of ridges 13 and the nearest fingers 23, 27 were equal and, hence, the capacitances were equal. Since multiple fingers on each of hands 21, 25 were used, individual errors were averaged. When relative movement of mask 1 and wafer 3 occured, as shown by the arrow in FIG. 5, one capacitance increased while the other decreased and the output of detector 43 deviated from zero. It should be noted that shields 37, 39 shown in FIG. 3B ensured that relative movement in a direction orthogonal to the arrow shown in FIG. 5 did not produce a change in the differential capacitances or a deviation in the output of detector 43. For optimal alignment sensitivity it was found that the period of the repetition pattern should be roughly 5 to 6 times the size of the gap.

Figure 7:
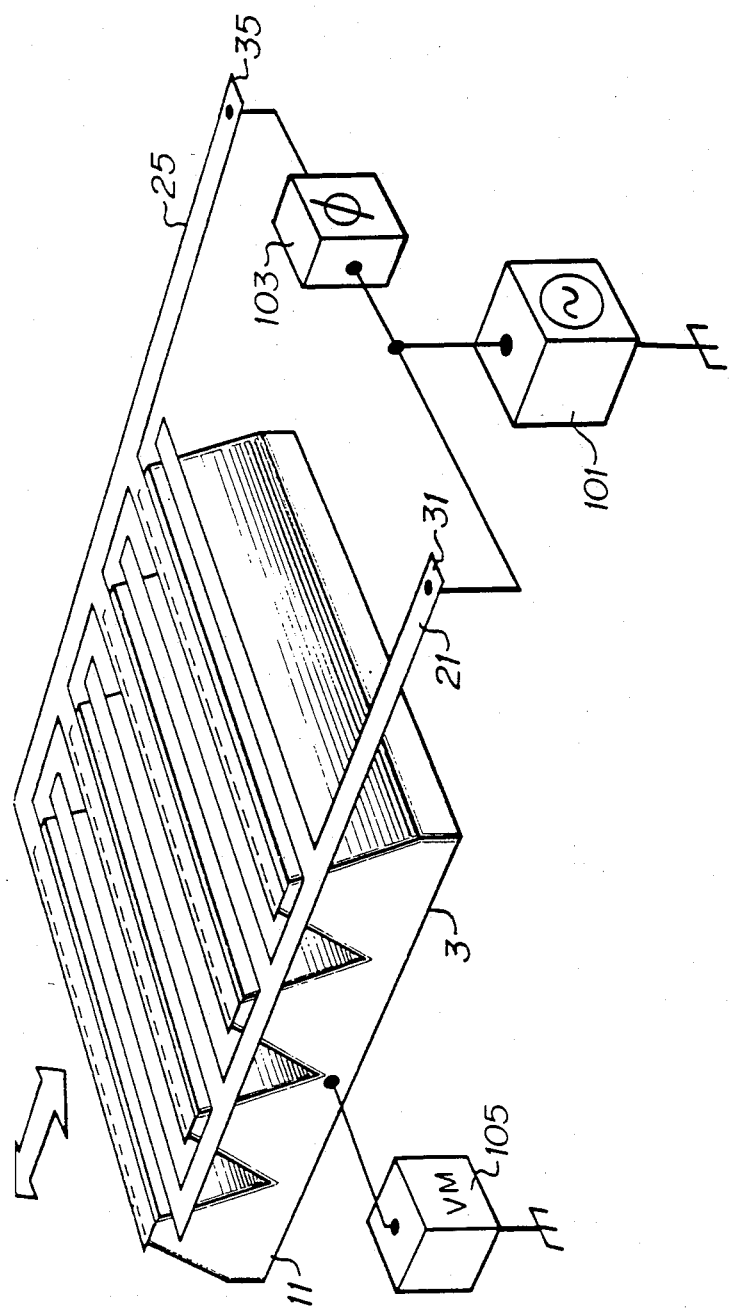
FIG. 7 is a perspective view of another preferred embodiment of the present invention in which the mask is driven with a signal.

FIG. 7 shows an aligner which is constructed in accordance with another preferred embodiment of the present invention with which alignment may be performed without applying a high voltage to wafer 3. An oscillator 101 provides a sine wave signal to side line 31 and to a non-attenuating phase shifter 103. The phase shifter 103 provides a sine wave signal to side line 35 which is of the same amplitude and frequency as the signal applied to side line 31 but which is phase shifted by 180 degrees. In order that the two signals have identical amplitudes and opposite phases, a Blumlein transformer may be used in place of the phase shifter 103. The Blumlein transformer, which is well known to persons of ordinary skill in the art, provides two outputs having identical amplitudes and opposite phases. The two outputs may be coupled to side lines 31 an 35, respectively. A voltmeter 105 detects a summation of the two signals which are coupled to wafer 3. When alignment is achieved the shifted and unshifted signals are coupled equally to wafer 3, the two signals cancel and a null is detected by voltmeter 105. Time or frequency multiplexing may be used if more than one aligner is utilized on a single wafer 3.

Figure 8:
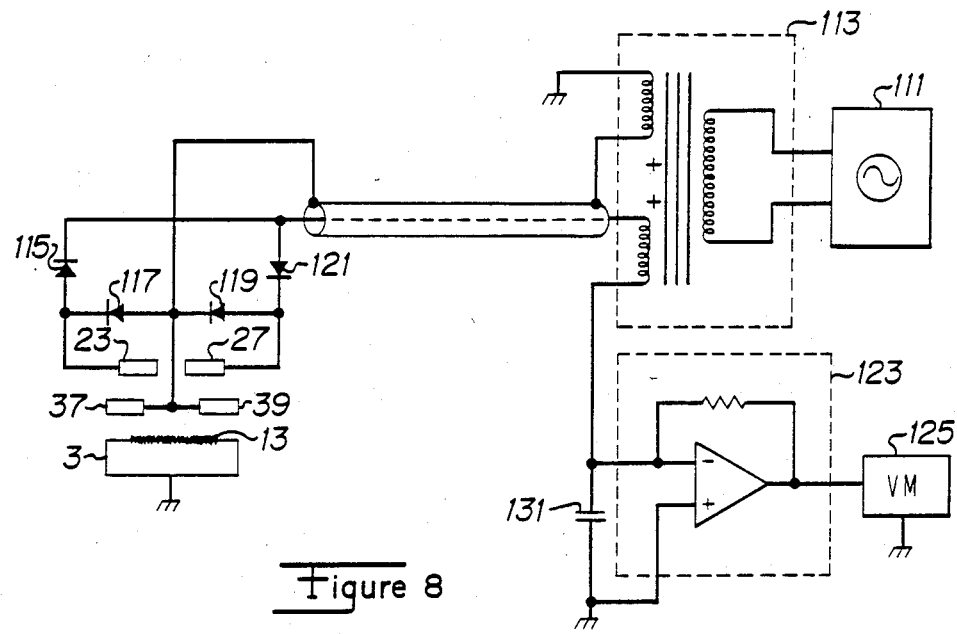
FIG. 8 is a schematic diagram of another preferred embodiment of the present invention in which the wafer is grounded.

FIG. 8 shows an aligner which is constructed in accordance with another preferred embodiment of the present invention with which alignment may be performed with wafer 3 grounded. A transformer 113 having matched windings provides a sine wave from driver 111 to fingers 23, 27 and to shields 37, 39 (shown in FIG. 3B) at the same amplitude. The aligner shown in FIG. 8 may be viewed as having an air gap capacitor (C1) between ridges 13 and fingers 27, and another air gap capacitor (C2) between ridges 13 and fingers 23. Charge is delivered to capacitor C1 from storage capacitor 131 during the positive portions of the sine wave and is returned to storage capacitor 131 from capacitor C2 during the negative portions. Any difference in capacitance between capacitors C1 and C2 (caused by misalignment) causes a net D.C. voltage across storage capacitor 131 which is detected by amplifier 123 and voltmeter 125. A null occurs when alignment is achieved.

Figure 9:
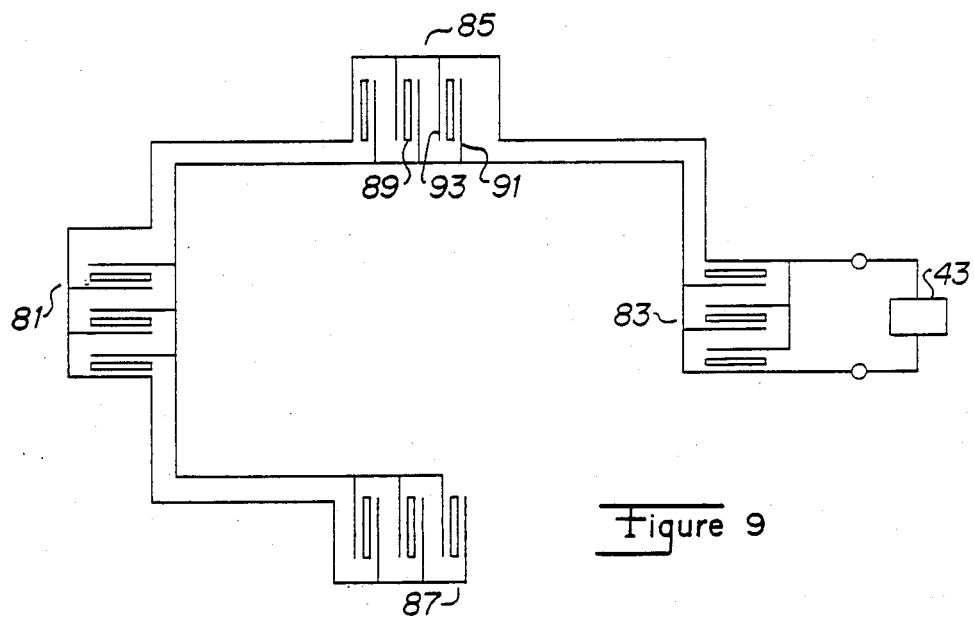
FIG. 9 shows a rotational aligner which uses four aligners which are constructed in accordance with the preferred embodiment of the present invention shown in FIG. 5.

FIG. 9 shows a rotational aligner which is constructed in accordance with another preferred embodiment of the present invention. Since the aligner shown in FIG. 5 does not provide alignment sensitivity in a direction which is orthogonal to the arrow depicted in FIG. 5 it is necessary to use two mutually orthogonal sets of ridges and fingers to provide simultaneous alignment in both an "x" and a "y" direction. Further, if four sets of ridge/fingers 81, 83, 85, 87 are used as shown in FIG. 9, rotational misalignment of 10 to 20 microradians can be detected and corrected. For the sake of illustrative clarity, only twelve ridges 89 and twenty-four fingers 91, 93 are shown while in reality the number will be dependent upon the space available and ridges 89 and fingers 91, 93 will be similar to ridges 13 and fingers 23, 27 shown in FIGS. 2–5. Shields as discussed above with reference to FIG. 3B should be used to avoid misalignment caused by unwanted capacitive coupling.

Figure 10:
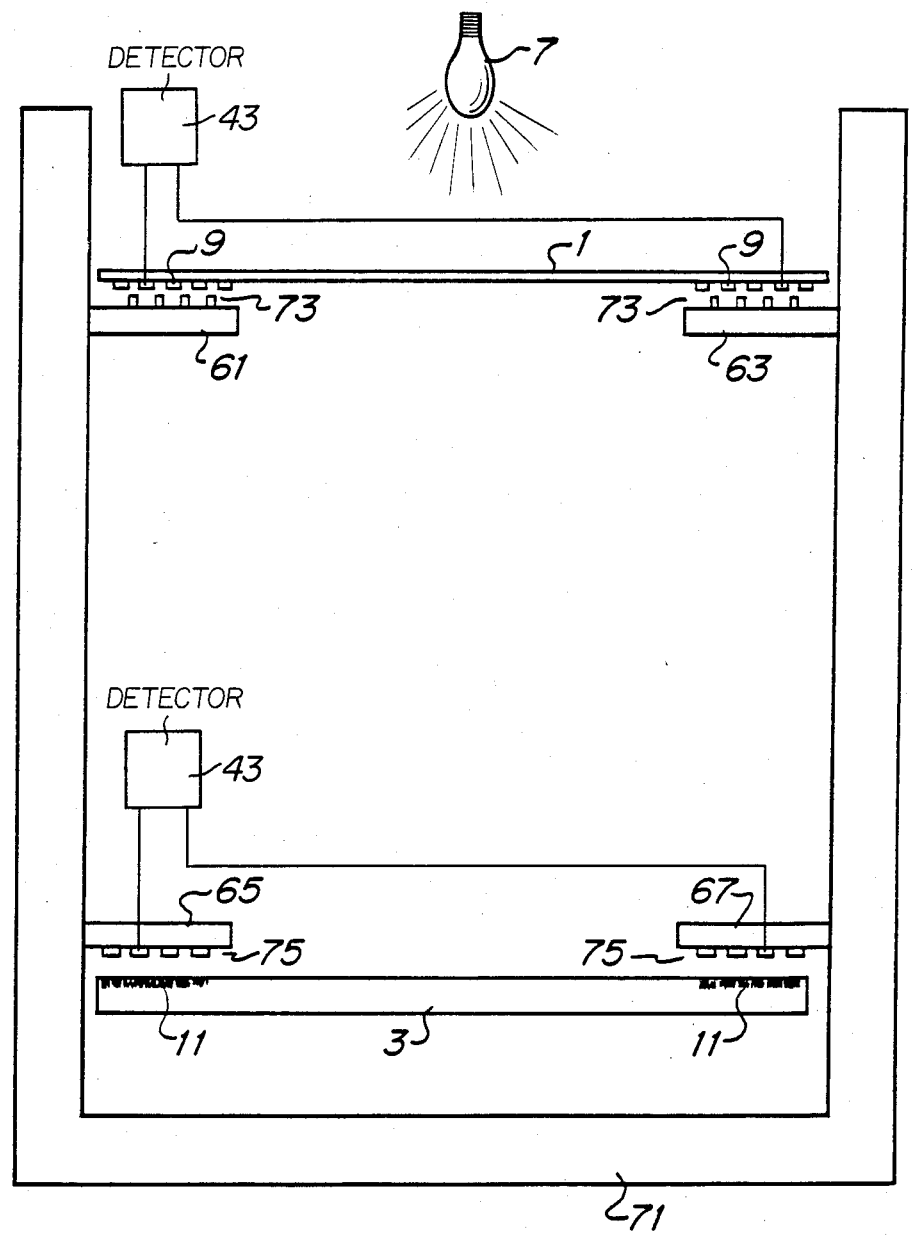
FIG. 10 is a side view of another preferred embodiment of the present invention in which the mask and the wafer are separated by a substantial distance.

FIG. 10 shows another preferred embodiment of the present invention in which a mask 1 and a wafer 3 are spaced a substantial distance apart as is required by various optical lithography methods. Thus, the capacitance between mask 1 and wafer 3 can not easily be measured. Instead, a rigid backbone 71 is equipped with two upper reference ledges 61, 63 and two lower reference ledges 65, 67 which are initially aligned together to provide a benchmark. Ledges 61, 63 include conductive ridges 73 which perform the same functions as do ridges 13 in FIG. 2. Thus, mask 1 can easily be aligned to ledges 61, 63 in the manner discussed above with reference to FIGS. 1–6 by driving ridges 73 with oscillator 41 and connecting detector 43 to finger region 9. In a like manner, ledges 65, 67 include fingers 75 and mask 3 can be aligned to ledges 65, 67 by driving wafer 3 with oscillator 41 and connecting detector 43 to fingers 75. Thus, alignment can be achieved without requiring that mask 1 be in close proximity with wafer 3.

We claim:

1. An aligner for aligning a primary element with a secondary element, the aligner comprising:
    a rigid backbone frame;
    an upper ledge attached to the frame;
    a lower ledge attached to the frame at a point lower than the upper ledge, the lower ledge being aligned with the upper ledge;
    an upper array located on the upper ledge;
    first and second hands located on the secondary element and capacitively coupled across an upper gap to the upper array;
    third and fourth hands located on the lower ledge;
    a lower array located on the primary element and capacitively coupled across a lower gap to the third and fourth hands;
    an upper oscillator, connected across the upper array, for driving the upper array with an upper electrical signal;
    a lower oscillator, connected across the lower array, for driving the lower array with a lower electrical signal;
    an upper detector, connected to the first and second hands, the upper detector being operative for measuring a first component of the upper signal at the first hand and for measuring a second component of the upper signal at the second hand; and
    a lower detector, connected to the third and fourth hands, the lower detector being operative for measuring a first component of the lower signal at the third hand and a second component of the lower signal at the fourth hand.

2. An aligner as in claim 1, wherein
    the first, second, third and fourth hands each comprise a plurality of substantially parallel conductive fingers disposed in first, second, third and fourths repetition patterns;
    the first hand fingers are interdigitated with the second hand fingers;
    the third hand fingers are interdigitated with the fourth hand fingers;
    the upper array comprises a plurality of substantially parallel ridges disposed in an upper repetition pattern; and,
    the lower array comprises a plurality of substantially parallel ridges disposed in a lower repetition pattern.

3. An aligner as in claim 2, wherein the number of first hand fingers and the number of second hand fingers are both equal to the number of upper array ridges.

4. An aligner as in claim 3, wherein the first and second repetition patterns are substantially identical to the upper repetition pattern.

5. An aligner as in claim 4, wherein the number of third hand fingers and the number of fourth hand fingers are both equal to the number of lower array ridges.

6. And aligner as in claim 4, wherein the third and fourth repetition patterns are substantially identical to the lower repetition pattern.

7. An aligner as in claim 6, wherein the first hand fingers and the second hand fingers are substantially parallel to the upper array ridges.

8. An aligner as in claim 7, wherein the third hand fingers and the fourth hand fingers are substantially parallel to the lower array ridges.

9. An aligner as in claim 8, wherein the primary element comprises a semiconductor wafer and the secondary element comprises a mask.

10. An aligner as in claim 9, wherein the lower array ridges on the wafer are separated by valleys which are etched into the wafer.

11. An aligner as in claim 9, wherein the lower array ridges comprise conductive traces on the wafer.

12. An aligner as in claim 9, wherein the upper repetition pattern has a period which is substantially constant and which is between five and six times the upper gap size.

13. An aligner as in claim 9, wherein the lower repetition pattern has a period which is substantially constant and which is between five and six times the lower gap size.

14. An aligner as in claim 9, wherein:
the first hand fingers are interconnected by a first side line;
the second hand fingers are interconnected by a second side line;
the third hand fingers are interconnected by a third side line; and
the fourth hand fingers are interconnected by a fourth side line.

15. An aligner as in claim 1, wherein the upper detector is further operative for presenting a null indication when the first and second components of the upper signal are equal in amplitude.

16. An aligner as in claim 15, wherein the lower detector is further operative for presenting a null indication when the first and second components of the lower signal are equal in amplitude.

17. An aligner as in claim 1, wherein the upper detector is further operative for presenting a null indication when the first and second components of the upper signal are equal in phase.

18. An aligner as in claim 17, wherein the lower detector is further operative for presenting a null indication when the first and second components of the lower signal are equal in phase.

19. An aligner as in any one of claims 1-18 wherein said aligner is a means for aligning elements in the beam of an X-ray radiation source.

* * * * *